US006533029B1

(12) United States Patent
Phillips

(10) Patent No.: US 6,533,029 B1
(45) Date of Patent: Mar. 18, 2003

(54) NON-INVERTED MENISCUS LOOP HEAT PIPE/CAPILLARY PUMPED LOOP EVAPORATOR

(75) Inventor: Fred A. L. Phillips, Pine Grove, PA (US)

(73) Assignee: Thermal Corp., Stanton, DE (US)

( * ) Notice: Subject to any disclaimer, the term of this patent is extended or adjusted under 35 U.S.C. 154(b) by 0 days.

(21) Appl. No.: 09/945,909

(22) Filed: Sep. 4, 2001

(51) Int. Cl.$^7$ ............................................. F28D 15/00
(52) U.S. Cl. ........................... 165/104.26; 165/104.33; 361/700; 257/715
(58) Field of Search ....................... 165/104.26, 104.33; 257/715; 361/700; 174/15.2

(56) References Cited

U.S. PATENT DOCUMENTS

| | | | | |
|---|---|---|---|---|
| 3,677,329 A | * | 7/1972 | Kirkpatrick | 165/104.26 |
| 4,351,388 A | | 9/1982 | Calhoun et al. | 165/104.26 |
| 4,440,215 A | * | 4/1984 | Grover et al. | 165/104.26 |
| 4,470,451 A | * | 9/1984 | Alario et al. | 165/104.26 |
| 4,515,209 A | | 5/1985 | Maidanik et al. | 165/104.22 |
| 4,833,567 A | | 5/1989 | Saaski et al. | 361/385 |
| 5,303,768 A | * | 4/1994 | Alario et al. | 165/104.26 |
| 5,335,720 A | | 8/1994 | Ogushi et al. | 165/104.26 |
| 5,346,000 A | * | 9/1994 | Schlitt | 165/104.26 |
| 5,508,884 A | * | 4/1996 | Brunet et al. | 165/80.4 |
| 5,884,693 A | | 3/1999 | Austin et al. | 165/104.33 |
| 5,890,371 A | | 4/1999 | Rajasubramanian et al. | 62/259.2 |
| 5,944,092 A | * | 8/1999 | Van Oost | 165/104.26 |
| 6,076,595 A | | 6/2000 | Austin et al. | 165/104.26 |
| 6,330,907 B1 | * | 12/2001 | Ogushi et al. | 165/104.26 |

OTHER PUBLICATIONS

Thermacore International Webpage, Article—"How It Works", dated Mar. 6, 2001 www.thermacore.com/hpt.htm, p. 1 of 1.

Thermacore International Webpage, Article—"Therma–Loop™: Loop Heat Pipes and Loop Thermosyphons", dated Mar. 6, 2001, www.thermacore.com/thermaloop.htm, p. 1–3.

Thermacore International Webpage, Article—"Loop Heat Pipe Flight Experiment Successful Aboard STS–87 Mission", dated Mar. 6, 2001, www.thermacore.com/pr%5Floop.htm, p. 1–2.

Internet Article—"Heat Pipes for Electronics Cooling Applications", by Scott D. Garner, PE., Thermacore, Inc., dated Mar. 6, 2001, www.electronics–cooling.com/Resources/EC_Articles/SEP96/sep96_02.htm, p. 1–10.

Internet Article—"Capillary Pumped Loops—Loop Heat Pipe Technology", dated Mar. 6, 2001, www.swales.com/products/capillary.html, p. 1–3.

Internet Article—"LHP Flight Experiment", dated Mar. 6, 2001, www.dynatherm–dci.com/lhpflightexp.htm, p. 1–2.

Internet Article—Loop Heat Pipe Background, dated Mar. 6, 2001, www.jpl.nasa.gov/adv_tech/thermal/LHP_overview.htm, p. 1.

* cited by examiner

*Primary Examiner*—Henry Bennett
*Assistant Examiner*—Terrell McKinnon
(74) *Attorney, Agent, or Firm*—Duane Morris LLP

(57) ABSTRACT

The invention introduces a two part wick for use in the evaporator of a two phase loop (LHP/CPL). The primary wick controls evaporation from the primary heat input area. The secondary or "distribution" wick separates the liquid and vapor volumes of the evaporator and feeds liquid to the primary wick. The secondary wick allows the primary wick to be configured so heat enters from the liquid side of the wick, this constitutes a non-inverted meniscus evaporator which can tolerate high heat fluxes without restricting vapor flow. The secondary wick is removed from the primary heat flow path lends itself to fabrication in small dimensions compatible with direct cooling of electronic devices.

10 Claims, 1 Drawing Sheet

US 6,533,029 B1

NON-INVERTED MENISCUS LOOP HEAT PIPE/CAPILLARY PUMPED LOOP EVAPORATOR

FIELD OF THE INVENTION

The present invention relates to a heat pipe system, and in particular, a two phase loop commonly known as a Loop Heat Pipe (LHP) or Capillary Pumped Loop (CPL).

DESCRIPTION OF THE RELATED ART

A basic heat pipe comprises a closed or sealed envelope or a chamber containing a liquid-transporting wick and a working fluid capable of having both a liquid phase and a vapor phase within a desired range of operating temperatures. When one portion of the chamber is exposed to relatively high temperature it functions as an evaporator section. The working fluid is vaporized in the evaporator section causing a slight pressure increase forcing the vapor to a relatively lower temperature section of the chamber defined as a condenser section. The vapor is condensed in the condenser section and returned through the liquid-transporting wick to the evaporator section by capillary pumping action.

Because it operates on the principle of phase changes rather than on the principles of conduction or convection, a heat pipe is theoretically capable of transferring heat at a much higher rate than conventional heat transfer systems. Consequently, heat pipes have been utilized to cool various types of high heat-producing apparatus, such as electronic equipment (See, e.g., U.S. Pat. Nos. 5,884,693, 5,890,371, and 6,076,595).

Because conventional heat pipes must transport liquid through the capillary wick, they incur a large flow pressure drop if they are made very long. Also, because liquid and vapor flow in opposite directions, vapor can entrain liquid at high power rates and limit the operation of the device; this is commonly known as the flooding limit. To overcome these limitations and transport high thermal power over long distances, the Loop Heat Pipe (LHP) and Capillary Pumped Loop (CPL) were developed. (See notably U.S. Pat. No. 4,515,209.)

In conventional heat pipes, heat almost always enters the heat pipe from the liquid (i.e., convex) side of the meniscus. As is known in the art, the meniscus is the curved shape of the surface of a liquid in a container, caused by the cohesive effects of surface tension (capillary action).

Alternatively, in capillary pumped two phase loop heat pipes, such as loop heat pipes (LHPs) and capillary pumped loops (CPLs), heat enters the device (e.g., LHP, CPL, etc.) from the vapor (i.e., concave) side of the meniscus. This is known as an inverted meniscus arrangement.

Because of the 'inverted meniscus' arrangement, devices such as LHPs and CPLs have relatively high thermal resistance in the evaporator area, and are typically not capable of operating at high heat fluxes without drying out. Thus, conventional LHPs/CPLs can dissipate approximately only 10 W/cm$^2$.

Some have utilized a method of filling the vapor spaces of the evaporator portion of the LHP/CPL with bidispersed wick in order to achieve higher heat dissipation figures. LHPs/CPLs with bidispersed wicks have achieved approximately 100 W/cm$^2$ of heat dissipation, however, at the expense of constricting vapor flow and maximum power capacity, as well as introducing considerable complexity and cost.

The nature of a two phase loop requires that the temperature difference (often referred to as 'delta T' or 'ΔT') from the vapor to the liquid side of the wick correspond to the capillary pressure being produced by the wick. If the ΔT is insufficient, then boiling will occur on the liquid side of the wick and the loop will deprime (i.e., stop operating). This ΔT relationship becomes increasingly more difficult to maintain as the wick dimensions are made smaller. Miniature evaporators for two phase loops are thus very difficult to design and build, and sub-miniature evaporators of a size that would permit integration with a semiconductor chip have so far not been feasible.

Therefore, there is currently a need for a two phase loop system which can accommodate high heat flux inputs without also restricting vapor flow. There is also a need for means to maintain a suitable ΔT in evaporators scaled to permit integration with semiconductor chips.

SUMMARY OF THE INVENTION

The present invention is a evaporator including a primary wick which controls evaporation from a primary heat input area and, a secondary wick which separates liquid and vapor volumes disposed in the evaporator, and which feeds liquid to the primary wick. The present invention also includes a method for cooling heat-producing equipment by disposing a heat-producing apparatus on the convex side of a meniscus of liquid located in a wick of a loop heat pipe.

The above and other advantages and features of the present invention will be better understood from the following detailed description of the exemplary embodiments of the invention which is provided in connection with the accompanying drawings.

DETAILED DESCRIPTION

Figure 1:
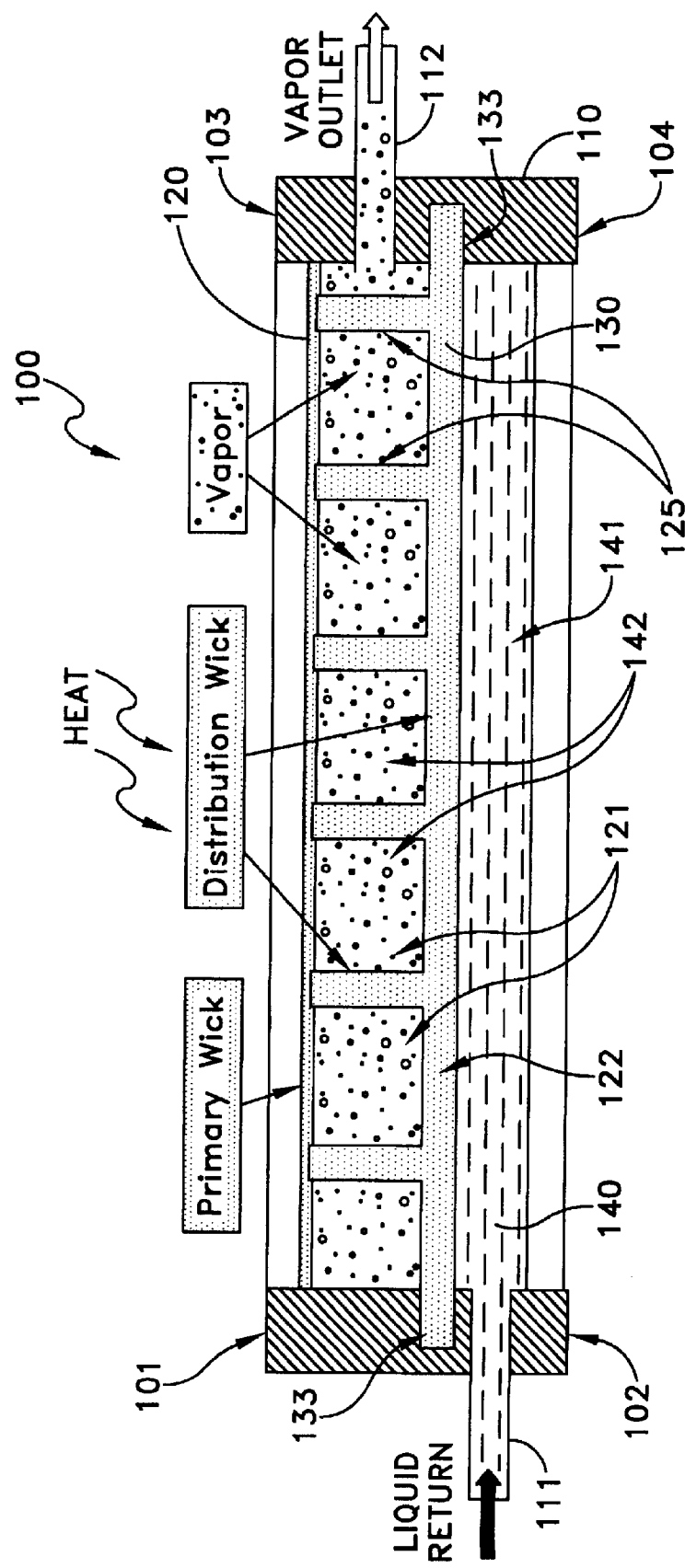
FIG. 1 is a perspective view showing an evaporator section of a loop heat pipe according to a first exemplary embodiment of the present invention.

The present invention comprises an evaporator for a two phase loop which does not employ an inverted meniscus, and which thereby allows both high heat flux and large vapor flows. This is accomplished by providing at least two wicks within the evaporator. The first or "primary" wick controls evaporative cooling from the heat input area. This primary wick functions in the same manner as the wick in a conventional heat pipe. This primary wick does not employ an inverted meniscus, and thus can tolerate high heat fluxes. This primary wick can be used in the evaporator of a two phase loop because of the addition of a secondary or "distribution" wick into the evaporator. The distribution wick provides two essential functions; it separates the liquid volumes from the vapor volumes within the evaporator, and it feeds liquid to the primary wick. In order for the distribution wick to feed liquid to the primary wick, the primary wick must have a smaller capillary pore radius than the distribution wick. The capillary pore radius of the distribution wick determines the pressure drop which may be incurred in the external portions of the two phase loop.

Note that the term "secondary wick" is commonly used in LHP technology in reference to a wick which provides a capillary connection between the compensation chamber and the evaporator. The secondary or distribution wick used in this application is in addition to the wick associated with the compensation chamber.

Referring to FIG. 1, there is shown an evaporator section 100 of a capillary pumped two phase loop according to a first exemplary embodiment of the present invention. Two phase loops typically include an evaporator section and a condenser section which are connected by vapor and liquid lines in a loop arrangement, as is well known in the art. For ease of discussion, the condenser section and the remainder of the tubing are not shown in FIG. 1.

The evaporator section 100 includes a housing 110, primary wick structure 120, secondary or distribution wick structure 130, and working fluid 140. The housing 110 includes respective sides 101, 102, 103 and 104 as well as a liquid inlet port 111 and vapor outlet port 112. The working fluid is present in both liquid 141 and vapor 142 states. The primary and secondary wick structures 120, 130 and the liquid 140 are all disposed within the housing 110, as is well known in the art. The housing 110 includes a liquid inlet port 111 for permitting liquid condensed in a condenser section of the loop heat pipe to return to the evaporator section 100, and a vapor outlet port 112 for permitting vapor created in the evaporator section to escape to the condenser section to be condensed. The liquid 140 preferably comprises water, but may comprise any suitable liquid.

As shown in FIG. 1, the secondary wick structure 130 (or 'distribution' wick) consists of separation structure 122 which separates the liquid and vapor states of the working fluid, and a number of post structures 125 which supply fluid to the primary wick 120. The secondary wick 130 may also contain support structures 133 which provide physical support to the assembly. Separation structure 122 is typically of planar form, while structures 125 and 133 are typically posts of square or cylindrical form. However, it will be noted that the entire secondary wick structure 130 may be formed in any desired shape to provide the above functions.

The primary wick structure 120 (or 'primary' wick) is substantially thinner in cross section than the secondary wick structure. Although the primary wick structure 120 is shown in FIG. 1 as an additional layer, it may be formed as etched grooves on the surface of the housing 110. The primary wick structure may comprise sintered powder, etched grooves, or any other equivalent structure. However, the primary wick structure 120 should have a smaller pore radius than the distribution wick structure 130 so that it can syphon liquid from the distribution wick structure.

In operation, heat (produced by some heat-producing apparatus) enters the evaporator section 100 from the first side 104 of the housing 110. The heat is transferred into the liquid contained within the primary wick structure 120 causing it to evaporate. This evaporation takes place in the primary wick structure 120 as would take place in the wick of a conventional heat pipe. As explained above, the distribution wick structure 130 serves a dual purpose: it separates the liquid in the evaporator section 100 from the vapor, and it assists in feeding liquid to the primary wick structure 120 via posts 125. Under some conditions, the secondary wick structure may contribute evaporation, especially from the posts 125.

It will be noted that in the evaporator section 100 heat (from some heat-producing apparatus) enters from the liquid (i.e., convex) side of the meniscus of the liquid 140 in the primary wick 120, thus creating a 'non-inverted meniscus' arrangement. Such an arrangement is now known for use in loop heat pipes, and provides significant advantages over conventional loop heat pipe arrangements.

In the evaporator structure described above, the second wick structure 130 ('distribution' wick) is removed from the primary heat flow path, thereby allowing it to be readily maintained at or near the temperature of the liquid, minimizing any propensity for the liquid to boil and deprime the device. In addition, the arrangement readily allows the distribution wick 130 to be fabricated from materials different from the primary wick or the housing, thereby contributing further to maintaining a large thermal resistance ($\Delta T$), and providing additional structural strength.

The design of the evaporator section 100 described above allows high heat fluxes without sacrificing vapor flow through the heat pipe or increasing thermal resistance. Furthermore, the evaporator section 100 may be easily manufactured in planar configurations, and allows fabrication in Silicon (Si), which allows on-chip cooling with the added ability to transport heat off-chip.

In an alternative embodiment of the present invention, the evaporator section 100 described above may be formed entirely of Silicon. In this alternative embodiment, the primary wick structure 120 may be formed as an etching on the inner surface of the first wall 104. An all-Silicon evaporator section is particularly useful in embodiment where the apparatus being cooled is made of Silicon as well (e.g., microchip).

The above-described evaporator section 100 of a heat pipe may be used to cool heat-producing apparatus contained within a desktop or laptop computer or server. For example, the evaporator section 100 may be disposed on or near a heat-producing apparatus such as a microchip or Central Processing Unit (CPU).

Although the invention has been described in terms of exemplary embodiments, it is not limited thereto. Rather, the appended claims should be construed broadly, to include other variants and embodiments of the invention which may be made by those skilled in the art without departing from the scope and range of equivalents of the invention.

What is claimed is:

1. An evaporator for a capillary pumped two phase loop comprising:

a primary wick which controls evaporation from a primary heat input area; and a planar secondary wick that is arranged so as to separate a volume of liquid from a volume of vapor that are disposed in the evaporator, wherein said planar secondary wick includes at least one post that supplies liquid from said liquid volume to the primary wick.

2. The evaporator of claim 1 wherein said at least one post comprises a shape that is at least one of square and cylindrical.

3. A computer comprising:

a heat-producing apparatus; and a heat pipe disposed adjacent the heat-producing apparatus, said heat pipe including a first wick structure and a second wick structure disposed adjacent to the first wick structure, wherein a liquid disposed within an evaporator section of the heat pipe is adjacent to said first wick structure such that said first wick structure lies between and separates said liquid from said second wick structure.

4. A computer comprising:

a heat-producing apparatus; and a heat pipe disposed adjacent the heat-producing apparatus, said heat pipe including a primary wick which controls evaporation from a primary heat input area of the heat producing apparatus, and a secondary wick which separates a volume of liquid from a volume of vapor that are disposed in an evaporator section of the heat pipe, and wherein said secondary wick feeds said liquid to the primary wick.

5. An evaporator structure comprising:

a first wick structure; and, a second wick structure disposed adjacent the first wick structure, wherein a liquid is disposed within the evaporator adjacent to said first wick structure such that said first wick structure lies between said liquid and said second wick structure and wherein said first wick structure feeds said liquid to said second wick structure.

6. An evaporator for a capillary pumped two phase loop comprising:

a primary wick which controls evaporation from a primary heat input area; and, a secondary wick that is arranged so as to separate a volume of liquid from a volume of vapor that are disposed in the evaporator, wherein said secondary wick feeds liquid from said liquid volume into the primary wick.

7. The evaporator of claim 6, wherein heat from the primary heat input area enters the evaporator on the liquid side of the primary wick.

8. The evaporator of claim 6, wherein the primary and secondary wicks are formed of different materials.

9. The evaporator of claim 6, wherein said secondary wick determines the loop pressure of the heat pipe.

10. The evaporator of claim 6, wherein said primary wick has smaller pores than said secondary wick.

* * * * *